(12) United States Patent
Alzaher

(10) Patent No.: US 8,588,721 B2
(45) Date of Patent: Nov. 19, 2013

(54) DUAL MODE RECEIVER CHANNEL SELECT FILTER

(75) Inventor: Hussain Alzaher, Dhahran (SA)

(73) Assignees: King Fahd University of Petroleum and Minerals, Dhahran (SA); King Abdulaziz City for Science and Technology, Riyadh (SA)

( * ) Notice: Subject to any disclaimer, the term of this patent is extended or adjusted under 35 U.S.C. 154(b) by 92 days.

(21) Appl. No.: 13/369,247

(22) Filed: Feb. 8, 2012

(65) Prior Publication Data
US 2013/0202066 A1    Aug. 8, 2013

(51) Int. Cl.
*H04B 1/06* (2006.01)
(52) U.S. Cl.
USPC ........ 455/266; 455/130; 455/552.1; 455/210; 455/306; 455/307
(58) Field of Classification Search
USPC ............. 455/41.2, 552.1, 130, 210, 209, 293, 455/306, 307, 230, 266, 309, 311, 326, 333, 455/337
See application file for complete search history.

(56) References Cited

U.S. PATENT DOCUMENTS

| | | | | |
|---|---|---|---|---|
| 5,822,704 A * | 10/1998 | Ishii | ........................... | 455/553.1 |
| 5,950,119 A * | 9/1999 | McGeehan et al. | ........... | 455/302 |
| 5,982,807 A * | 11/1999 | Snell | ............................. | 375/146 |
| 6,778,594 B1 * | 8/2004 | Liu | ............................... | 375/222 |
| 7,283,840 B2 | 10/2007 | Cho | | |
| 7,590,396 B2 | 9/2009 | Behzad et al. | | |
| 7,844,230 B2 | 11/2010 | Darabi et al. | | |
| 2011/0002257 A1 | 1/2011 | Behzad et al. | | |

OTHER PUBLICATIONS

A new CMOS channel select filter for dual mode bluetooth/WLAN direct-conversion receiver, Hussain A. Alzaher, Sep. 16, 2009, Springer Science + Business Media, LLC 2009.

* cited by examiner

*Primary Examiner* — Tuan Pham
(74) *Attorney, Agent, or Firm* — Richard C Litman

(57) ABSTRACT

The dual mode receiver channel select filter includes a filter for a dual mode Bluetooth/Wireless Local Area Network (WLAN) receiver portion of a BT/WLAN transceiver. The filter is a 4th order complex filter and is digitally programmable and reconfigurable. Implemented as the channel select filter for dual-mode receivers, the filter adopts low-IF for Bluetooth and zero-IF for WLAN (IEEE 802.11b). It is based on simple active elements, such as current and voltage followers. The center frequency is digitally tuned through programming active current division networks (CDNs).

12 Claims, 7 Drawing Sheets

DUAL MODE RECEIVER CHANNEL SELECT FILTER

BACKGROUND OF THE INVENTION

1. Field of the Invention

The present invention relates generally to radio transceiver systems, and more particularly to a dual mode receiver channel select filter configured for switching between Bluetooth and 802.11b wireless reception.

2. Description of the Related Art

CMOS receivers with dual-mode Bluetooth (BT) and WLAN (IEEE 802.11b) operational capabilities offer extreme flexibility for short-range wireless personal area network applications. As BT and 802.11b share the same RF frequency spectrum, they can use the same RF front-end in the receiver architecture. A low-IF receiver is suitable for BT application, as it provides a solution to dc offset and flicker noise problems associated with zero-IF topology. The main drawback of a low-IF receiver is that it suffers from problems of image signals, which can sometimes be larger than the wanted signal. Complex filters provide the solution to image rejection in low-IF wireless applications. On the other hand, Zero-IF is more attractive for the reception of WLAN signals. Flicker noise does not degrade the receiver performance because of the wide bandwidth of the signal. Also, low-IF topology is expected to be power inefficient due to the relatively large bandwidth of 802.11b. Dual-mode transceivers incorporating low-IF for BT and Zero-IF (direct conversion) for 802.11b are known in the art. A typical receiver topology is where the local oscillator and the channel select filter must be programmable to accommodate both standards. Switching between the two modes is achieved by static switches.

For BT, a low-IF receiver incorporates a single conversion to an IF (in this work 3 MHz) that is a few times higher than the channel bandwidth (1 MHz). A complex filter is required for channel selection, as well as for image rejection. For WLAN mode, the signal is mixed directly to baseband, requiring separate baseband paths to maintain the negative frequency information. Highly linear I (in-phase) and Q (quadrature) identical low pass filters are needed for channel selection.

Thus, a dual mode receiver channel select filter solving the aforementioned problems is desired.

SUMMARY OF THE INVENTION

The dual mode receiver channel select filter includes a filter for a dual mode Bluetooth/wireless local area network (WLAN) receiver portion of a BT/WLAN transceiver. The filter is a 4th order complex filter and is digitally programmable and reconfigurable. Implemented as the channel select filter for dual-mode receivers, the filter adopts low-IF for Bluetooth and zero-IF for WLAN (IEEE 802.11b). It is based on simple active elements, namely, current and voltage followers. The center frequency is digitally tuned through programming active current division networks (CDNs).

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
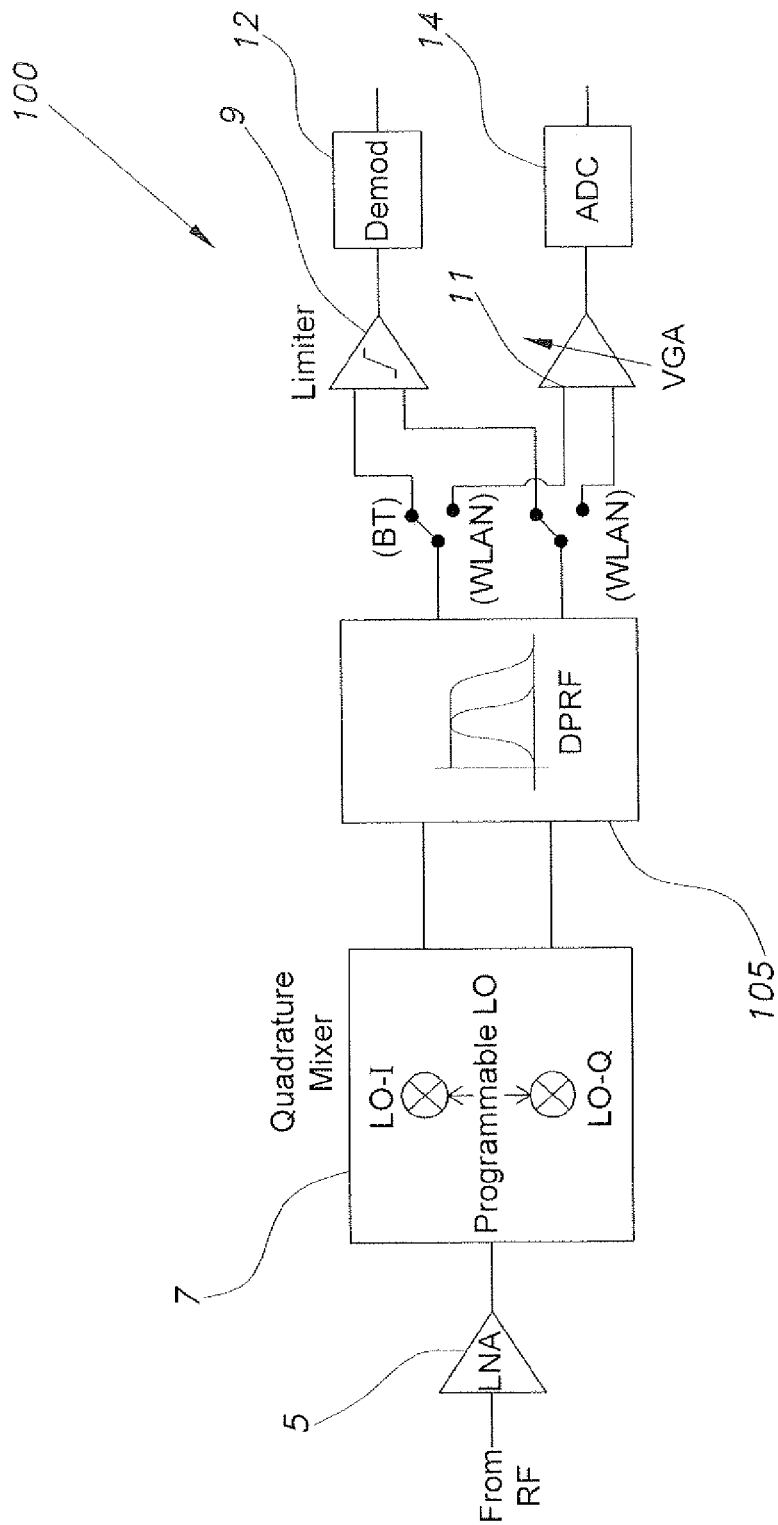
FIG. 1 is a schematic diagram of a typical dual mode receiver circuit having a dual mode receiver channel select filter according to the present invention incorporated therein.

As shown in FIG. 1, the digital programmable reconfigurable filter (DPRF) 105 is a dual mode receiver polyphase channel select filter incorporated in a receiver section 100 of a Blue Tooth (BT)/Wireless Local Area Network (WLAN) transceiver. The receive circuit 100 includes a low noise amplifier (LNA) 5 that amplifies input radio frequency (RF) signals before passing the amplified RF to the input of a Quadrature Mixer 7, where in phase (I) and quadrature (Q) signals are mixed with their respective local oscillators (LO). The digital programmable reconfigurable filter 105 accepts output from the mixer 7 and provides output to Bluetooth (BT) and wireless local area network (WLAN) switches, which direct the output either to a limiter 9 combined with a demodulator 12 when in Bluetooth mode, or to a variable gain amplifier 11 combined with an analog-to-digital converter 14 when in WLAN mode. The filter 105 preferably comprises a plurality of Digitally Controlled Current Followers (DCCFs), such as exemplary DCCF 500 (shown in FIG. 5A), and a plurality of Current-Division Networks (CDNs), such as exemplary CDN 400 (shown in FIG. 4A). Each CDN 400 is configured as a tuning element employed within a respective DCCF 500. Those skilled in the art of filter design will note that with the DCCF-CDN filter design there is no need for inverters, since the output terminals are exchanged to reverse the signal polarity. Each DCCF 500 has programmable gain, while each tuning element CDN 400 is area efficient and highly linear. The CDN 400 permits the achievement of a wide digitally programmable tuning range with high resolution, but without component spreading. The digital tuning property of the CDN 400 allows direct interfacing with a digital signal processor (DSP) portion of the transceiver, available in most modern systems.

As known in the art, Bluetooth (BT) specifications require attenuations of 30 dB and 40 dB of blockers at 5 MHz and 6 MHz, respectively, when the center frequency is 3 MHz. Moreover, Wireless Local Area Network (WLAN) 802.11b requires attenuation of 35 dB at 25MHz. It can be shown that the most stringent selectivity specification comes from the BT blocker at 5 MHz that must be attenuated by 30 dB. Butterworth response must be adopted to satisfy the BT in-band group delay. A 3rd order Butterworth response can provide 31 dB attenuation at 5 MHz, whereas a 4th order filter achieves about 42 dB attenuation. However, a prior art digitally programmable polyphase filter for Bluetooth designed by the inventor was obtained from its first order LPF (low pass filter) counterpart. Since the quality factor of a first order LPF is one-half, the prior art complex filter cannot be used to realize the desired Butterworth response. Hence, six sections were needed to satisfy the selectivity requirement, resulting in excessive power consumption. The digital programmable reconfigurable filter (DPRF) 105 represents a more efficient design solution.

Figure 2:
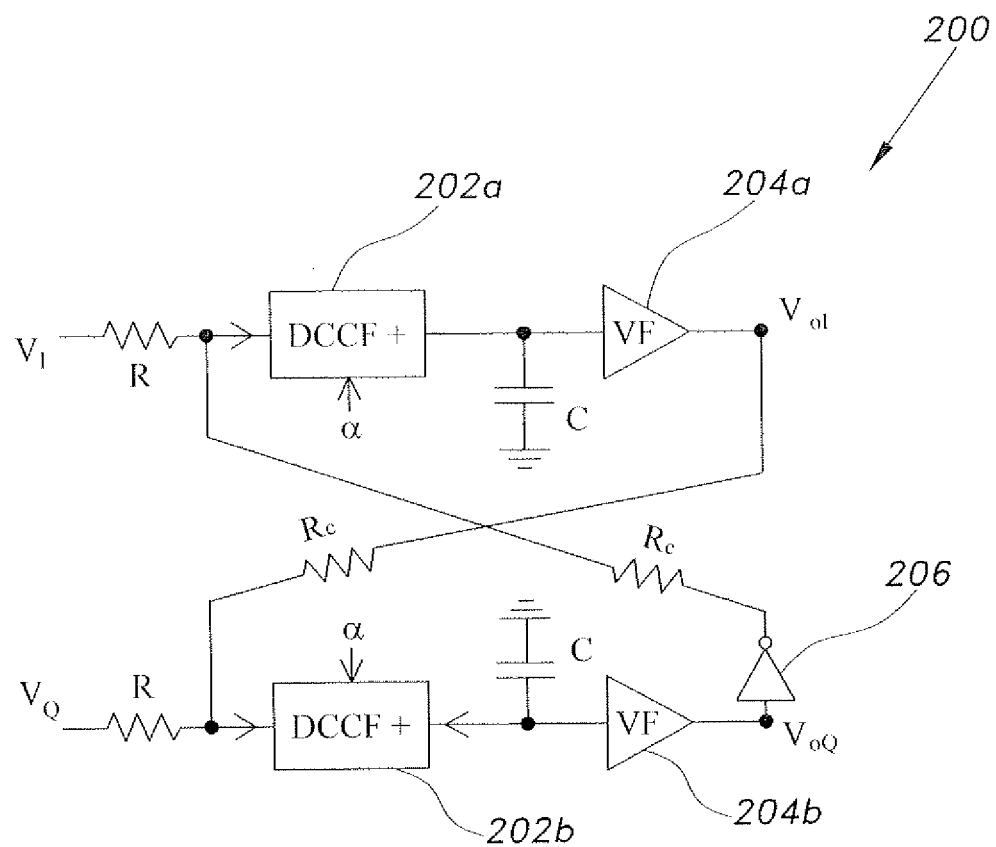
FIG. 2 is a schematic diagram of a digitally programmable complex integrator for a dual mode receiver channel select filter according to the present invention.

The design starts with developing a complex lossless integrator. The integrator is utilized to develop a complex filter based on second order LPF based on the two-integrator loop topology. The quality factor of the digital programmable reconfigurable filter (DPRF) 105 can be set arbitrarily, resulting in a more optimum design. It is known that an arbitrary low pass filter can be converted to a bandpass complex filter centered at $\omega_c$ when every frequency dependent element in the LPF is modified to be a function of $s-j\omega_c$, instead of s. In the case of transforming a normal integrator to its polyphase counterpart, a complex feedback loop is realized by cross-coupling between the in-phase (I) and quadrature (Q) paths, as is done in integrator circuit 200, Shown in FIG. 2. DCCF 202a is in series with Voltage Follower (VF) 204a. DCCF 202b is in series with VF 204b. The output of VF 204b feeds DCCF 202a, while the output of VF 204a feeds DCCF 202b, thereby providing the cross-coupled configuration required. It can be shown that the transfer characteristics are given by:

$$\frac{V_{oI}}{V_I} = \frac{V_{oQ}}{V_Q} = \frac{1}{\left(s - j\frac{\alpha}{CR_c}\right)\frac{CR}{\alpha}} \quad (1)$$

Figure 3A:
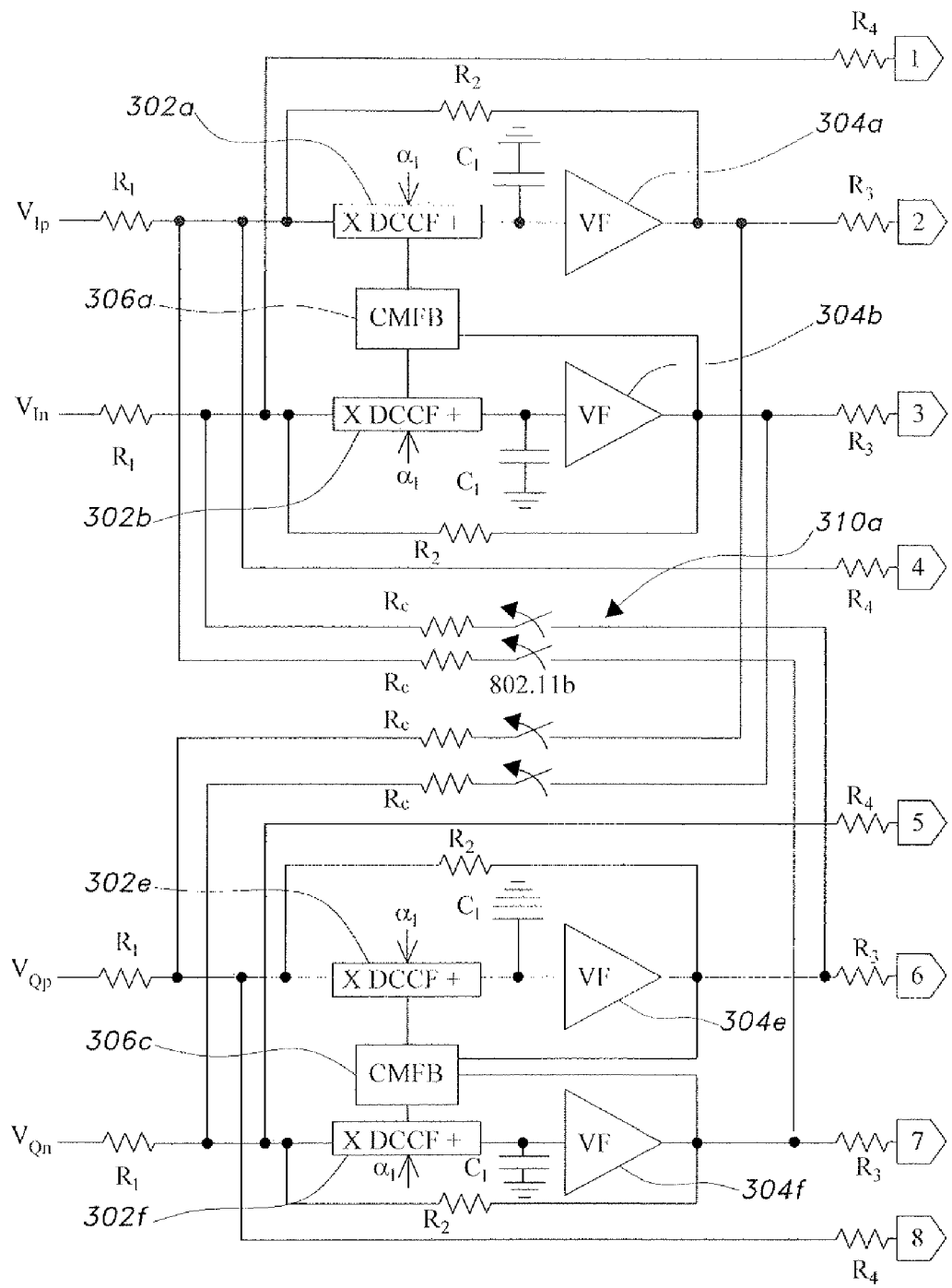
FIGS. 3A-3B show a schematic diagram of a reconfigurable biquad circuit section of the dual mode receiver channel select filter according to the present invention.
Figure 3B:
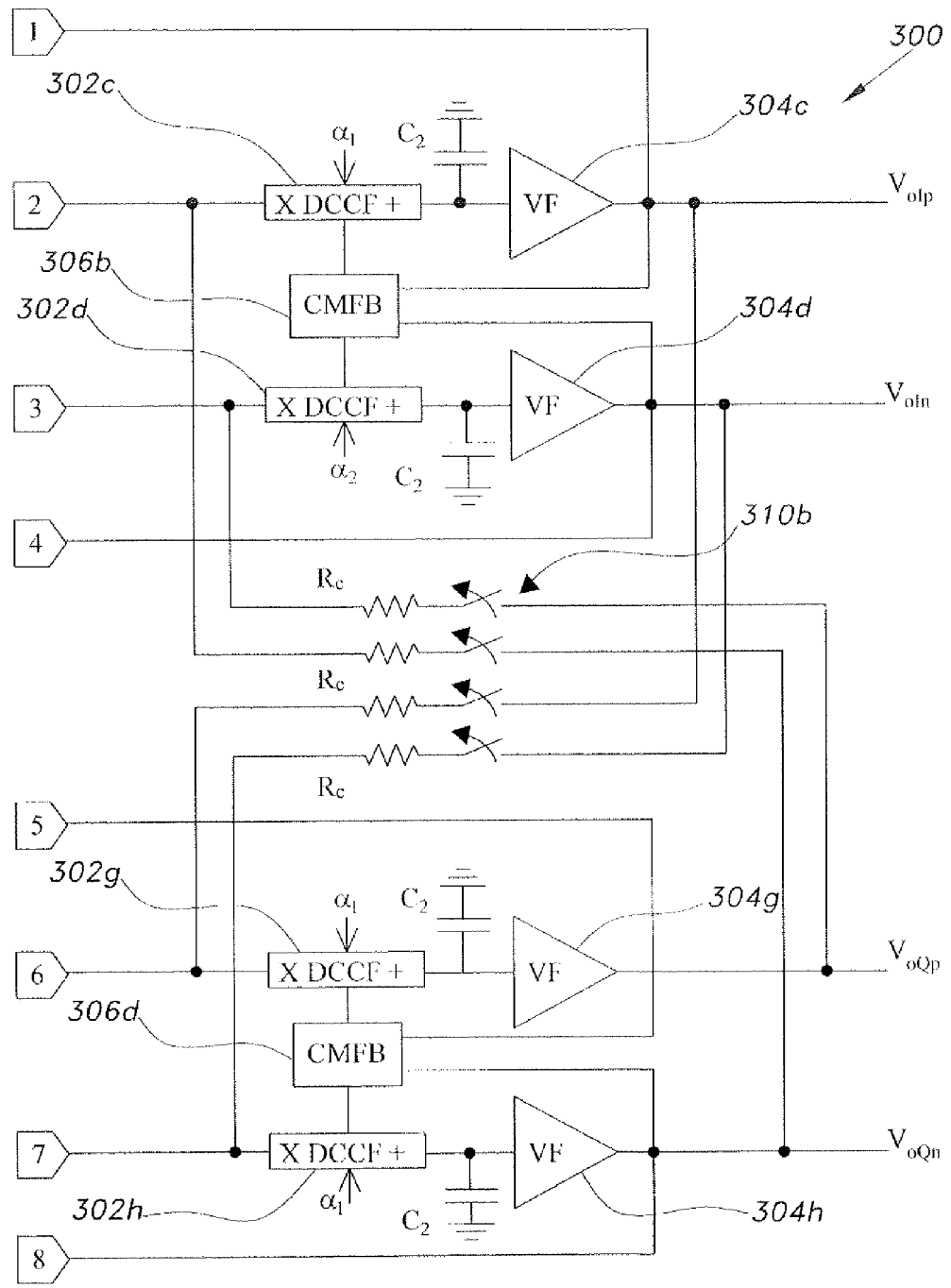

Thus, the time constant of the complex integrator is $CR/\alpha$, the same as the original integrator, while $\omega_c = \alpha/CR_c$. The fully differential reconfigurable filter section 300 is shown in FIGS. 3A-3B. DCCFs 302a and 302b are cross-couple connected with DCCFs 302e and 302f via VFs 304a, 304b, 304e and 304f, respectively. Similarly, in a second stage, DCCFs 302c and 302d are cross-couple connected with DCCFs 302g and 302h via VFs 304c, 304d, 304g, and 304h, respectively. Moreover, there is feedback coupling between VF 304c and DCCF 302b, VF 304d and DCCF 302a, VF 304g and DCCF 302f, and VF 304h and DCCF 302e.

A single common-mode feedback (CMFB) circuit can be employed to establish the common-mode voltage of both the DCCF and the VF, while obviating the necessity for resistor and/or capacitor arrays for tuning. FIGS. 3A and 3B show the use of four such circuits, designated as CMFB 306a and CMFB 306c in FIG. 3A and CMFB 306b and 306d in FIG. 3B, in the biquad circuit of the filter 105. Moreover, switching between the two modes is achieved by using switches 310a and 310b in the cross-coupling connections, It can be shown that the general transfer function for the complex response of circuit 300 is given by:

$$H_P(s) = \frac{\alpha_1\alpha_2/(C_1C_2R_1R_3)}{(s-j\omega_c)^2 + (s-j\omega_c)\alpha_1/(C_1R_2) + \alpha_1\alpha_2/(C_1C_2R_3R_4)} \quad (2)$$

Hence, the filter exhibits center frequency, pole frequency, pole quality factor, and center frequency gain of:

$$\omega_c = \frac{\alpha}{CR_c} \quad (3)$$

$$\omega_o = \frac{\alpha}{C\sqrt{R_3R_4}} \quad (4)$$

$$Q_o = \frac{\omega_o}{BW} = \frac{R_2}{\sqrt{R_3R_4}} \quad (5)$$

$$H_o = \frac{R_4}{R_1} \quad (6)$$

Also, the bandwidth of the complex filter is $2\omega_o$. The image rejection ratio (IRR) for the complex filter can be expressed as:

$$IRR = \sqrt{(1+4(\omega_c/\omega_o)^2)^2 + (4/Q^2)(\omega_c/\omega_o)^2} \quad (7)$$

Therefore, selecting a higher center frequency for BT improves the IRR. On the other hand, it can be shown that the ideal image rejection ratio (IRR) of any complex filter obtained from first order LPF is given by:

$$IRR = \sqrt{1+4(\omega_c/\omega_o)^2} \quad (8)$$

This means that the dual mode receiver channel select filter inherently exhibits a better IRR than two cascaded stages of first order. In addition, the pole frequency $f_o$ is set to 1.43 MHz for each section in prior art embodiments so that the overall bandwidth of a six-stage design becomes 1 MHz. This leads to a nominal IRR per stage of 12.7 dB. On the other hand, the IRR of a second order Butterworth biquad ($f_o$=0.5 MHz) is 43.3 dB, as in the present dual mode receiver channel select filterdual mode receiver channel select filter. When the switches are opened, the filter is reconfigured as a normal low pass biquad with the following transfer function:

$$H_{LP}(s) = \frac{\alpha^2/(C^2R_1R_3)}{s^2 + s\alpha/(CR_2) + \alpha^2/(C^2R_3R_4)} \quad (9)$$

The main parameters of the filter, namely, pole frequency, pole quality factor, and low pass gain, are given by equations (4) through (6), respectively. Since the parameters $\omega_c$ and $\omega_o$ are functions of RC products, the programmability feature must be adopted for their tuning. They can be tuned without disturbing Q and $H_o$ through the adjustment of $\alpha = \alpha_1 = \alpha_2$. On the other hand, $H_o$ and $Q_o$ can be implemented precisely in ICs, since they are functions of resistor and/or capacitor ratios.

Figure 4B:
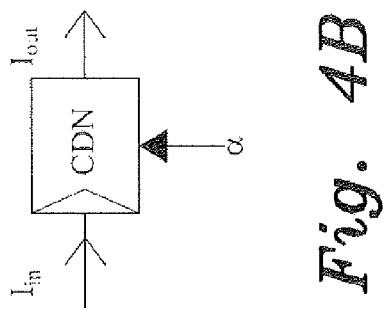
FIG. 4B is a block diagram symbol used herein as the equivalent of the circuit of FIG. 4A.
Figure 4A:
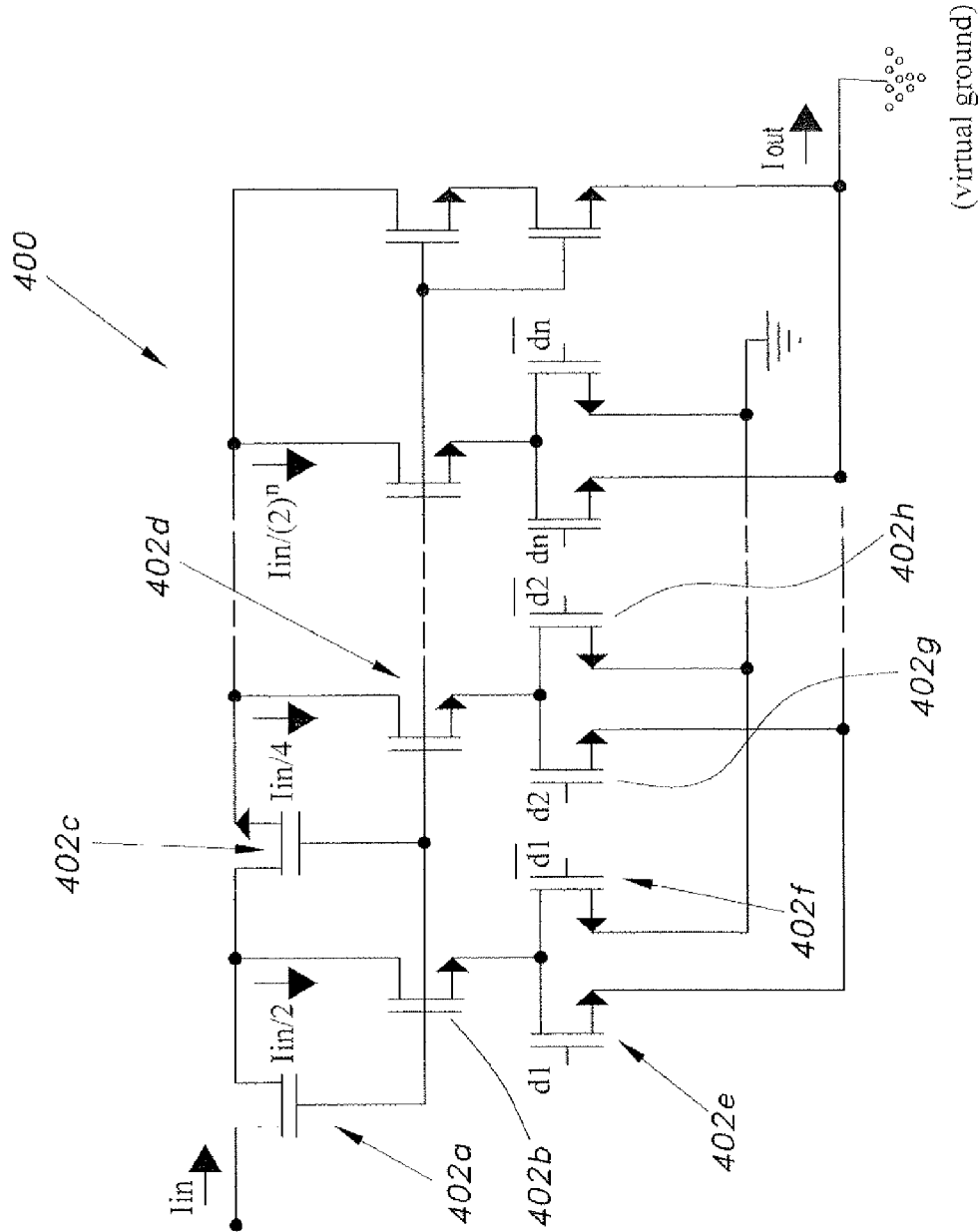
FIG. 4A is a schematic diagram of a current division network circuit of the dual mode receiver channel select filter according to the present invention.
Figure 5A:
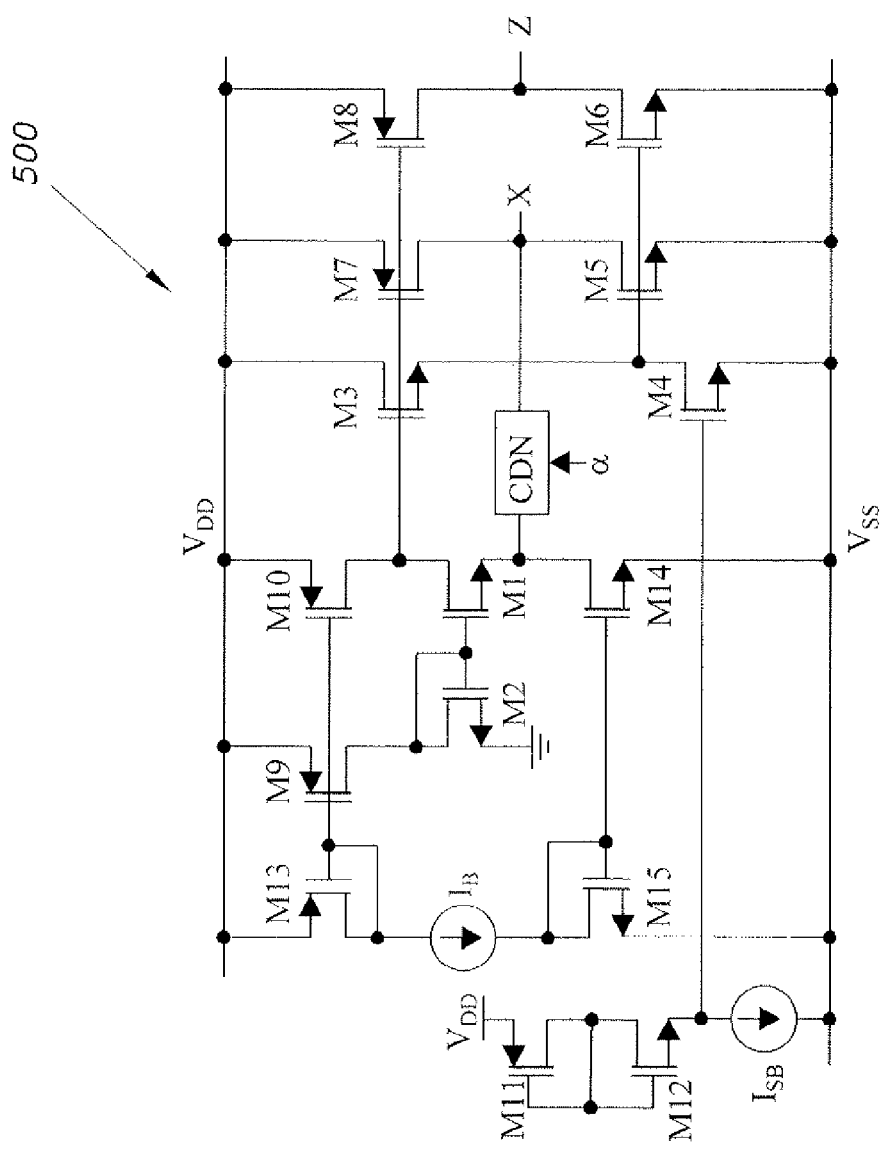
FIG. 5A is a schematic diagram of a digitally controlled current follower circuit of the dual mode receiver channel select filter according to the present invention.
Figure 5B:
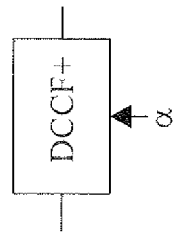
FIG. 5B is a block diagram symbol used herein as the equivalent of the circuit of FIG. 5A.

Exemplary CDN 400 has a simple structure utilizing MOSFETS 402a, 402b, 402c, 402d, 402e, 402f, 402g, and 402h, as shown in FIG. 4. It is inherently linear (i.e., insensitive to second order effects and valid in all MOS operating regions). The input current is binary-weighted through the different circuit branches. The output current can be expressed as:

$$I_o = \sum_{i=1}^{n} \frac{d_i I_{in}}{2^i} \quad (10)$$

where $d_i$ is the i-th digital bit and n is the size of the control word. The CDN is suitable for low power operation, since it does not dissipate standby current. The proper operation of the CDN requires the input node to be current-driven, while the output node should be virtually grounded. A current division network (CDN) can be utilized in the design of a CF to form the exemplary digitally controlled CF (DCCF) 500, as shown in FIG. 5A. The equivalent block diagram with control input is shown in FIG. 5B.

In the DCCF, the CDN is driven by the drain current of M5 and M7, while its outputs $I_o$ are connected to the virtual ground node X. The current at terminal X ($I_x$) is provided by the output current of the CDN ($I_o$), while the negative feedback loop adjusts the DCCF output ($I_z$) to be equal to the CDN input ($I_{in}$). Therefore, the transfer current characteristic of the DCCF becomes:

$$I_z = \alpha I_x \text{ with } \alpha = 1/\Sigma_{i=1}^n d_i 2^{-i}$$

The feedback reduces the input resistance to:

$$r_x \approx \alpha/[g_{m1}(g_{m5}+g_{m7})(r_{ds1}//r_{ds10})]$$

where $g_m$ and $r_{ds}$ are the transconductance and the output resistance of the MOSFET, respectively. The linearity of the DCCF mainly depends on the value of $r_x$ (nominally few tens of ohms). The resistance $r_x$ is linear for small signal operation, but for large signal operation, it introduces non-linearity. Since the value of $r_x$ is very small, the linearity of the DCCF can be improved by selecting large passive resistances in series with the X terminal.

Figure 6:
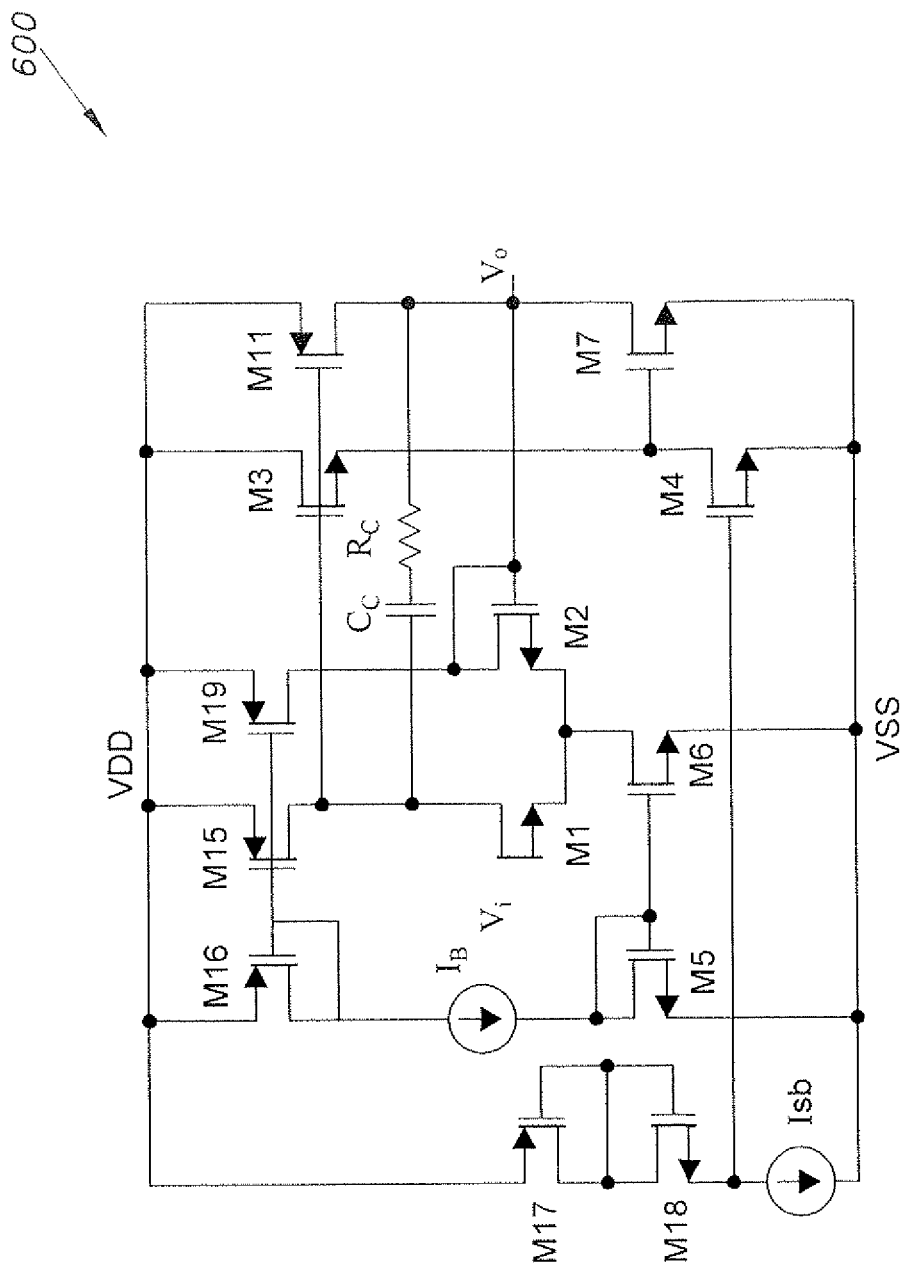
FIG. 6 is a schematic diagram of a voltage follower circuit portion of the digitally programmable reconfigurable filter according to the present invention.

The most basic VF is the source follower circuit. However, since the transconductance of the MOS transistor is small, a negative feedback has to be applied to provide the required low output impedance. Also, additional circuitry is required to cancel the large DC offset between the input and the output. To avoid distortion caused by the body effect, a differential pair should be employed at the input port of the VF. CMOS realization of a low power VF with class AB output stage is shown in FIG. 6.

Switching between the two standards is achieved by proper selection of resistors, and the tuning within each standard is achieved through CDNs. Using resistors for switching between standards allows optimization of noise performance. Relatively low resistances are used to balance the noise contribution of the wide bandwidth of 802.11b. In the BT mode, the filter operates as a complex filter to attenuate the strong image signals, while it operates as normal low pass filter in 802.11b mode. The BT mode has an exemplary band pass center frequency set and adjustable between approximately 2 MHz and approximately 4 MHz, and preferably set to approximately 3 MHz. The WLAN mode has an exemplary substantially flat pass band of approximately 1.25 octaves (in MHz).

The dual mode receiver channel select filter contemplates development of a filter with Spurious Free Dynamic Range (SFDR) better than gm-C filters, while it overcomes the bandwidth and programmability problems associated with op-amp based circuits. It is observed that voltage follower (VF)-based filters exploit the maximum possible bandwidth of active-RC technique. Such filters maintain the high SFDR of active-RC filters, but with higher frequency operating ranges.

The dual mode receiver channel select filter inherently has the potential to operate at higher frequency band than active-RC and provide better linearity than g m-C techniques. If the dual mode receiver channel select filter is designed to realize only complex filters, its power consumption is optimized, since tradeoffs between power consumption, noise, and linearity performances would be less stringent.

It is to be understood that the present invention is not limited to the embodiments described above, but encompasses any and all embodiments within the scope of the following claims.

I claim:

1. A dual mode radio receiver circuit, comprising:
   a low noise amplifier (LNA) amplifying RF signals input to the LNA;
   an I/Q quadrature mixer having first and second in-phase (I) outputs, first and second quadrature (Q) outputs, and an RF input, the RF input accepting RF signal output from the low noise amplifier;
   a dual mode filter unit having:
      first, second, third, and fourth DCCFs (Digitally Controlled Current Followers), the first and second DCCFs accepting the first and second I outputs, respectively from the I/Q quadrature mixer, and the third and fourth DCCFs accepting the first and second Q outputs, respectively from the I/Q quadrature mixer;
      first, second, third and fourth CDNs (Current-Division Networks) configured for controlling the first, second third, and fourth DCCFs, respectively;
      fifth, sixth, seventh, and eighth DCCFs, the fifth, sixth, seventh, and eighth DCCFs being cross-couple connected to the first, second, third, and fourth DCCFs;
      fifth, sixth, seventh and eighth CDNs configured for controlling the fifth, sixth, seventh, and eighth DCCFs, respectively, each of the CDNs having a mode control input responsive to a mode control signal, $\alpha$, the CDNs changing frequency passband channel characteristics exhibited by the dual mode filter unit responsive to the $\alpha$ control signal, thereby switching the dual mode filter unit between first and second modes of the dual mode filter unit; and
      a dual-mode filter unit output;
   a demodulator operably connected to the dual mode filter unit output when the dual mode filter unit is in the first mode; and
   an analog-to-digital converter (ADC) operably connected to the dual mode filter unit output when the dual mode filter unit is in the second mode.

2. The dual mode radio receiver circuit according to claim 1, further comprising means for setting a bandpass center frequency of said dual mode filter unit to about 3 MHz when said dual mode filter unit is in the first mode.

3. The dual mode radio receiver circuit according to claim 2, further comprising means for adjusting the bandpass center frequency of said dual mode filter unit between about 2 MHz and about 4 MHz.

4. The dual mode radio receiver circuit according to claim 2, wherein the first mode is Bluetooth mode.

5. The dual mode radio receiver circuit according to claim 1, further comprising means for setting a substantially flat pass band of said dual mode filter unit to about 1.25 octaves when said dual mode filter unit is in the second mode.

6. The dual mode radio receiver circuit according to claim 5, wherein said second mode is WLAN (Wireless Local Area Network) mode.

7. A dual mode receiver channel select filter, comprising a dual-mode filter unit having:
   first, second, third, and fourth DCCFs (Digitally Controlled Current Followers), the first and second DCCFs being adapted for accepting first and second I outputs, respectively, from an I/Q quadrature mixer, the third and fourth DCCFs being adapted for accepting first and second Q outputs, respectively, from the I/Q quadrature mixer;
   first, second, third and fourth CDNs (Current-Division Networks) configured for controlling the first, second third, and fourth DCCFs, respectively;

fifth, sixth, seventh, and eighth DCCFs, the fifth, sixth, seventh, and eighth DCCFs being cross-couple connected to the first, second, third, and fourth DCCFs;

fifth, sixth, seventh and eighth CDNs configured for controlling the fifth, sixth, seventh, and eighth DCCFs, respectively, each of the CDNs having a mode control input responsive to a mode control signal, $\alpha$, the CDNs changing frequency passband channel characteristics exhibited by the dual mode filter unit responsive to the $\alpha$ control signal, thereby switching the dual mode filter unit between first and second modes of the dual mode filter unit; and a dual-mode filter unit output.

8. The dual mode receiver channel select filter according to claim 7, further comprising means for setting a bandpass center frequency of said dual mode filter unit to about 3 MHz when said dual mode filter unit is in the first mode.

9. The dual mode receiver channel select filter according to claim 8, further comprising means for adjusting the bandpass center frequency of said dual mode filter unit between about 2 MHz and about 4 MHz.

10. The dual mode receiver channel select filter according to claim 8, wherein the first mode is Bluetooth mode.

11. The dual mode receiver channel select filter according to claim 7, further comprising means for setting a substantially flat pass band of said dual mode filter unit to about 1.25 octaves when said dual mode filter unit is in the second mode.

12. The dual mode receiver channel select filter according to claim 11, wherein the second mode is a WLAN (wireless local area network) mode.

\* \* \* \* \*